(12) United States Patent
Mizuguchi et al.

(10) Patent No.: US 6,487,174 B1
(45) Date of Patent: Nov. 26, 2002

(54) S/N MEASURING CIRCUIT AND METHOD, TRANSMITTING ELECTRIC POWER CONTROL APPARATUS AND DIGITAL COMMUNICATING SYSTEM

(75) Inventors: Hironori Mizuguchi, Tokyo (JP); Shousei Yoshida, Tokyo (JP); Akihisa Ushirokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/113,219

(22) Filed: Jul. 10, 1998

(30) Foreign Application Priority Data

Jul. 11, 1997 (JP) .............................. 9-186388

(51) Int. Cl.$^7$ ................................ H04B 7/00
(52) U.S. Cl. ...................... 370/252; 375/227; 455/69
(58) Field of Search ................... 370/252, 318; 455/522, 69, 62.1; 375/130, 140, 141, 147, 227, 340

(56) References Cited

U.S. PATENT DOCUMENTS

| 5,450,453 A | * | 9/1995 | Frank ........................ 375/130 |
| 5,533,047 A | * | 7/1996 | Mourot et al. .............. 375/149 |
| 5,603,096 A | * | 2/1997 | Gilhousen et al. ............ 455/69 |
| 6,088,324 A | * | 7/2000 | Sato .......................... 370/203 |

FOREIGN PATENT DOCUMENTS

JP       4-50738       2/1993

* cited by examiner

*Primary Examiner*—Chau Nguyen
*Assistant Examiner*—Jasper Kwoh
(74) *Attorney, Agent, or Firm*—Scully, Scott, Murphy & Presser

(57) ABSTRACT

In a transmitting electric power control apparatus, non-linear bias characteristic in S/N measurement is previously obtained by measurement, and a conversion table for realizing this reverse characteristic is created in an S/N measuring circuit 10, and when a measured S/N value is output from the dividing circuit 9, the table conversion circuit 1 receives this S/N value as an input and outputs a corrected S/N value from the above-described conversion table, whereby it is possible to provide the S/N measurement with high accuracy, and this corrected and measured S/N is compared with a target S/N, and a demand for increasing and decreasing transmitting electric power is transmitted to a mobile station 53, and, in the mobile station 53, in accordance with the instruction from the base station 20, the transmitting electric power is determined and a coded information signal is transmitted.

3 Claims, 5 Drawing Sheets

US 6,487,174 B1

S/N MEASURING CIRCUIT AND METHOD, TRANSMITTING ELECTRIC POWER CONTROL APPARATUS AND DIGITAL COMMUNICATING SYSTEM

BACKGROUND OF THE INVENTION

The present invention relates to a transmitting electric power control apparatus used in a digital mobile communicating system.

In a digital mobile communicating system, transmitting electric power control is used for suppressing consumption of electric power at a mobile station while maintaining reception quality at a desired value, and for avoiding i,unnecessary interference with other mobile stations. Especially, in a CDMA (Code Division Multiple Access) system, due to the existence of common frequency interference (interference with other users) inherent in a multiple system, the transmitting electric power control is essential. In the CDMA system, generally, closed-loop type transmitting electric power control is used, in which a Signal-to-Noise Power Ratio (referred to as an S/N, hereinafter) is measured from a signal received and demodulated at a base station, instruction is sent to the mobile station so that this S/N value will be a value enough for desired reception quality, and transmitting electric power is sequentially controlled. A noise N used here includes a thermal noise and an interference signal. In order to conduct transmitting electric power control with good accuracy, it is necessary to correctly measure the S/N in a receiving device.

As an S/N measuring method, there is a technology shown in JP-B-50738/1992 (referred to as a first prior art, hereinafter). FIG. 4 is a view showing an SIN measuring circuit of the first prior art. As shown in FIG. 4, an S/N measuring circuit 50 of the first prior art is constructed of a modulation removing circuit 3 connected to an analog-digital (A/D) converter 2, a first averaging circuit 4, a first square operating circuit 5, a second square operating circuit 6 connected to the analog-digital (A/D) converter 2, a second averaging circuit 7, a subtracting circuit 8, and a dividing circuit 9.

In this first prior art, first, a demodulated reception signal is sampled at a modulation clock by the A/D converter 2. In the S/N measuring circuit, after a modulated component of an output of the A/D converter 2 is removed in the modulation removing circuit 3, the output is averaged over a plurality of symbol sections in the first averaging circuit 4, and an amplitude value in which a noise component is suppressed is obtained. An output of the first averaging circuit 4 is squared by the first square operating circuit 5, and desired signal power S is obtained.

On the other hand, an output of the A/D converter 2 is supplied to the second square operating circuit 6, and is converted into time series having a dimension of electric power. Thereafter, the output is averaged over a plurality of symbol sections by the second averaging circuit 7, and total electric power P of demodulated signals is obtained. The subtracting circuit 8 obtains noise electric power N by subtracting the desired signal power S from the total electric power P of the demodulated signals. The dividing circuit 9 receives the obtained S and N as above, and calculates a ratio S/N thereof.

If representing the above-mentioned operation by an equation, it is represented as an equation (1) below. A series of sampled values of demodulated signals are assumed as $r_k$ (k=1, 2, ..., M, M is a positive integer.). If an amplitude of a signal point in which a noise is suppressed is A, the desired signal power S is shown by two equations described below.

$$A = \frac{1}{M}\sum_{k=1}^{M} r_k \hat{r}_k \quad (\hat{r}_k \text{ is a decision symbol.}) \quad (1)$$

$$S = |A|^2 \quad (2)$$

Hereupon, a noise component superimposed over a demodulated signal shows a Gaussian distribution of which center is at the amplitude A of the signal point in the absence of the noise, and the noise electric power N is given by the following equation (3):

$$N = \frac{1}{M}\sum_{k=1}^{M}(r_k \hat{r}_k^* - A)^2 \quad (3)$$

The above-described equation (3) can be transformed into the following equations (4) to (7):

$$N = \frac{1}{M}\sum_{k=1}^{M}(r_k \hat{r}_k^* - A)^2 \quad (4)$$

$$= \frac{1}{M}\sum_{k=1}^{M}|r_k \hat{r}_k^*|^2 - 2A\frac{1}{M}\sum_{k=1}^{M} r_k \hat{r}_k^* + A^2 \quad (5)$$

$$= \frac{1}{M}\sum_{k=1}^{M}|r_k \hat{r}_k^*|^2 - A^2 \quad (6)$$

$$= P - S \quad (7)$$

In other words, by subtracting the desired signal power S from the total electric power P of the reception signals, the noise electric power N is obtained. Although the first prior art of FIG. 4 is a simple arrangement based on the above-described equation (7), an arrangement based on the above-described equation (4) is naturally considered, and these arrangements are equal to each other in principle.

However, in this technology, in case that the received S/N is low, since there is an error in a decision signal and accuracy of inverse modulation by means of the decision signal deteriorates, a non-linear bias in which a measured S/N value appears higher is observed as the received S/N is lower.

FIG. 5 is a view showing a conventional transmitting electric power control apparatus using the S/N measuring circuit shown in FIG. 4. In FIG. 5, a base station 51 includes a demodulator 11 connected to an antenna, a decoder 12, a target S/N control circuit 52, an adder 13, a decision device 14, a TPC bit generating circuit 15, and a transmitter 16 connected to an antenna. The target S/N control circuit 52 includes a reception quality measuring circuit 61, an adder 62, a decision device 63 and a target S/N determining circuit 64. Also, a mobile station 53 includes a demodulator 21 connected to an antenna, a TPC bit decoder 22, a transmitting electric power determining circuit 23, a transmitter 24, and an encoder 25.

In the transmitting electric power control apparatus of FIG. 5, demodulated signals demodulated by the demodulator 11 are sampled at a modulation clock by the A/D converter 2. A series of sampled values of the demodulated signals that are outputs of the A/D converter 2 are input to the decoder 12, and information signals after the decoding are obtained. On the other hand, an output of the A/D converter 2 is supplied to the S/N measuring circuit 50. The S/N measuring circuit 50 has the same arrangement as the S/N measuring circuit 50 shown in FIG. 4, and in the S/N measuring circuit, a non-linear bias in which a measured S/N value appears higher is observed as the received S/N is lower. Accordingly, if transmitting electric power control is conducted using the measured S/N output from the S/N measuring circuit 50, transmitting electric power of the mobile station is decreased more than it needs, and reception characteristic rapidly deteriorates. In order to solve this, a method of correcting a bias of the measured S/N value is proposed, in which reception quality such as a bit error ratio is monitored separately, and the control target S/N value itself is adaptively changed in accordance with the reception quality. This is generally called an outer-loop, and there is a literature "An Overview of the Application of Code Division Multiple Access (CDMA) to Digital Cellular Systems and Personal Networks" (Document EX60-10010, Qualcolm Incorporated, San Diego, May 1992.).

In the target S/N control circuit 52 shown in FIG. 5, the reception quality measuring circuit 61 receives an information signal decoded in the decoder 12, and measures reception quality. The adder 62 obtains a difference between the reception quality measured by the reception quality measuring circuit 61 and target reception quality, and supplies the difference to the decision device 63. The decision device 63 determines an amount of increase or decrease of the target S/N based on the output from the adder 62. The target S/N determining circuit 64 determines the target S/N based on the amount of the increase or decrease of the target S/N determined by the decision device 63. The adder 13 calculates a difference between the measured S/N output from the S/N measuring circuit 50 and the target S/N output from the target S/N determining circuit 64, and supplies the difference to the decision device 14. The decision device 14 determines an amount of increase or decrease of transmitting electric power to the mobile station 53 based on the output from the adder 13. The amount of increase or decrease of the transmitting electric power determined by the decision device 14 is converted into a bit by the TPC bit generating circuit 15, and is transmitted to the mobile station by the transmitter 16.

Also, in the mobile station 53, the demodulator 21 demodulates a signal transmitted by the base station 51. A demodulated signal that is an output from the demodulator 21 is input to the TPC bit decoder 22, and the TPC bit decoder decodes the TPC bit generated in the base station 51. The decoded TPC bit is input to the transmitting electric power determining circuit 23, and transmitting electric power of the mobile station 53 is determined. In accordance with the transmitting electric power determined by the transmitting electric power determining circuit 23, the transmitter 24 transmits an information signal encoded by the encoder 25.

In the method using the above-mentioned outer-loop, since it is necessary to provide means for monitoring the reception quality separately, there is a task that a scale of the apparatus becomes to be large.

Also, since measurement over a comparatively long section is necessary for monitoring the reception quality and cannot cope with a comparatively fast change of the S/N associated with a change of a user or the like, there is a task that accuracy of the transmitting electric power control deteriorates.

SUMMARY OF THE INVENTION

Therefore, the objective of the present invention is to solve the above-mentioned tasks.

Also, the objective of the present invention is to provide an S/N measuring circuit and method capable of conducting S/N measurement with high accuracy.

Moreover, another objective of the present invention is to provide a transmitting electric power control apparatus capable of simply conducting transmitting electric power control with high accuracy using the above-described S/N measuring circuit.

Furthermore, yet another objective of the present invention is to provide a digital mobile communicating system including the above-described transmitting electric power control apparatus, and a base station thereof.

In accordance with the present invention, an S/N measuring circuit is provided, which includes a modulation removing circuit, connected to an A/D converter for receiving a signal demodulated from a digital modulated signal and sampling the demodulated signal at a modulation clock, for removing data modulation by multiplying a sampled value of a demodulated signal that is an output from the above-described A/D converter by a decision symbol signal, a first averaging circuit for averaging an output from the above-described modulation removing circuit over a plurality of symbol sections to suppress a noise superimposed over the demodulated signal, a first square operating circuit for squaring an output from the above-described first averaging circuit to obtain a desired signal power, a second square operating circuit for applying square operation to the sampled value of the demodulated signal that is an output from the above-described A/D converter, a second averaging circuit for averaging an output from the above-described second square operating circuit over a plurality of symbol sections to obtain total electric power of the demodulated signal, a subtracting circuit for subtracting the desired signal power that is an output from the above-described first square operating circuit from the total electric power of the demodulated signal that is an output from the above-described second averaging circuit to obtain noise electric power, and a dividing circuit for receiving the desired signal power that is an output from the above-described first square operating circuit and the noise electric power that is an output from the above-described subtracting circuit, and calculating an S/N value, wherein the S/N measuring circuit has a table conversion circuit for receiving the S/N value output from the above-described dividing circuit and outputting an S/N value corrected in accordance with a predetermined conversion table.

Also, in accordance with the present invention, the above-described S/N measuring circuit is provided, wherein the above-described table conversion circuit removes a non-linear bias occurred from a symbol error in case that the S/N value output from the above-described dividing circuit is small by providing characteristic by means of the above-described conversion table, which is the reverse of characteristic previously obtained by measurement of a corresponding relation between the S/N value output from the above-described dividing circuit and an actual S/N value of the demodulated signal.

Moreover, in accordance with the present invention, a transmitting electric power control apparatus for controlling transmitting electric power of an information signal transmitted to a base station from a mobile station is provided, wherein the above-described base station has a demodulator for receiving a digital modulated and coded information signal and conducting demodulation, an A/D converter for sampling an output from the above-described demodulator at a modulation clock, a decoder for decoding a demodulated signal that is an output from the above-described A/D converter and outputting an information signal, a modulation removing circuit for removing data modulation by multiplying a sampled value of the demodulated signal that is an output from the above-described A/D converter by a decision symbol signal, a first averaging circuit for averaging an output from the above-described modulation removing circuit over a plurality of symbol sections to suppress a noise superimposed over the demodulated signal, a first square operating circuit for squaring an output from the above-described first averaging circuit to obtain a desired signal power, a second square operating circuit for applying square operation to the sampled value of the demodulated signal that is an output from the above-described A/D converter, a second averaging circuit for averaging an output from the above-described second square operating circuit over a plurality of symbol sections to obtain total electric power of the demodulated signal, a subtracting circuit for subtracting the desired signal power that is an output from the above-described first square operating circuit from the total electric power of the demodulated signal that is an output from the above-described second averaging circuit to obtain noise electric power, a dividing circuit for receiving the desired signal power that is an output from the above-described first square operating circuit and the noise electric power that is an output from the above-described subtracting circuit, and obtaining an S/N value, a table conversion circuit for receiving the S/N value output from the above-described dividing circuit and outputting an S/N value corrected in accordance with a predetermined conversion table, an adder for obtaining a difference between a measured S/N that is an output from the above-described table conversion circuit and a target S/N that is a control target value of transmitting electric power, a decision device for determining an amount of increase or decrease of the transmitting electric power, which is instructed to the above-described mobile station, from the difference between the measured S/N and the target S/N, which is an output from the above-described adder, a TPC bit generating circuit for converting an output result from the above-described decision device into a bit, and a transmitter for transmitting a TPC bit determined in the above-described TPC bit generating circuit to the mobile station, and the above-described mobile station has a demodulator for receiving a digital modulated TPC signal and conducting demodulation, a TPC bit decoder for deciding a TPC bit from an output from the above-described demodulator, a transmitting electric power determining circuit for receiving the TPC bit that is an output from the above-described TPC bit decoder and determining transmitting electric power of the mobile station, and a transmitter for transmitting a coded information signal based on the transmitting electric power determined by the above-described transmitting electric power determining circuit.

Also, in accordance with the present invention, the above-described transmitting electric power control apparatus is provided, wherein the above-described table conversion circuit removes a non-linear bias occurred from a symbol error in case that the S/N value output from the above-described dividing circuit is small by providing characteristic by means of the above-described conversion table, which is the reverse of characteristic previously obtained by measurement of a corresponding relation between the S/N value output from the above-described dividing circuit and an actual S/N value of the demodulated signal.

Moreover, in accordance with the present invention, a base station of a digital mobile communicating system for conducting communication while controlling transmitting electric power of an information signal transmitted to the base station from a mobile station is provided, wherein the base station has a demodulator for receiving a digital modulated and coded information signal and conducting demodulation, an A/D converter for sampling an output from the above-described demodulator at a modulation clock, a decoder for decoding a demodulated signal that is an output from the above-described A/D converter and outputting an information signal, a modulation removing circuit for removing data modulation by multiplying a sampled value of the demodulated signal that is an output from the above-described A/D converter by a decision symbol signal, a first averaging circuit for averaging an output from the above-described modulation removing circuit over a plurality of symbol sections to suppress a noise superimposed over the demodulated signal, a first square operating circuit for squaring an output from the above-described first averaging circuit to obtain a desired signal power, a second square operating circuit for applying square operation to the sampled value of the demodulated signal that is an output from the above-described A/D converter, a second averaging circuit for averaging an output from the above-described second square operating circuit over a plurality of symbol sections to obtain total electric power of the demodulated signal, a subtracting circuit for subtracting the desired signal power that is an output from the above-described first square operating circuit from the total electric power of the demodulated signal that is an output from the above-described second averaging circuit to obtain noise electric power, a dividing circuit for receiving the desired signal power that is an output from the above-described first square operating circuit and the noise electric power that is an output from the above-described subtracting circuit, and obtaining an S/N value, a table conversion circuit for receiving the S/N value output from the above-described dividing circuit and outputting an S/N value corrected in accordance with a predetermined conversion table, an adder for obtaining a difference between a measured S/N that is an output from the above-described table conversion circuit and a target S/N that is a control target value of transmitting electric power, a decision device for determining an amount of increase or decrease of the transmitting electric power, which is instructed to the above-described mobile station, from the difference between the measured S/N and the target S/N, which is an output from the above-described adder, a TPC bit generating circuit for converting an output result from the above-described decision device into a bit, and a transmitter for transmitting a TPC bit determined in the above-described TPC bit generating circuit to the mobile station.

Furthermore, in accordance with the present invention, a digital mobile communicating system including the above-described base station and the above-described mobile station is provided, wherein the above-described mobile station has a demodulator for receiving a digital modulated TPC signal and conducting demodulation, a TPC bit decoder for deciding a TPC bit from an output from the above-described demodulator, a transmitting electric power determining circuit for receiving the TPC bit that is an output from the above-described TPC bit decoder and determining transmitting electric power of the mobile station, and a transmitter for transmitting a coded information signal based on the transmitting electric power determined by the above-described transmitting electric power determining circuit.

Also, in accordance with the present invention, an S/N measuring method is provided, and the method includes steps of (a) removing data modulation by multiplying a sampled value of a demodulated signal that is an output from an A/D converter by a decision symbol signal, the A/D converter receiving a signal demodulated from a digital modulated signal and sampling the demodulated signal at a modulation clock, (b) averaging the demodulated signal in which the data modulation is removed over a plurality of symbol sections to suppress a noise superimposed over the demodulated signal, (c) squaring the averaged signal to obtain a desired signal power, (d) applying square operation to the sampled value of the demodulated signal that is an output from the A/D converter, (e) averaging the squared value over a plurality of symbol sections to obtain total electric power of the demodulated signal, (f) subtracting the desired signal power from the total electric power to obtain noise electric power, (g) receiving the desired signal power and the noise electric power, and calculating an S/N value, and (h) receiving the S/N value and outputting an S/N value corrected in accordance with a predetermined conversion table.

Moreover, in accordance with the present invention, in the above-described SIN measuring method, the step (h) includes a step of removing a non-linear bias occurred from a symbol error in case that the S/N value is small by providing characteristic by means of the conversion table, which is the reverse of characteristic previously obtained by measurement of a corresponding relation between the S/N value and an actual S/N value of the demodulated signal.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Figure 1:
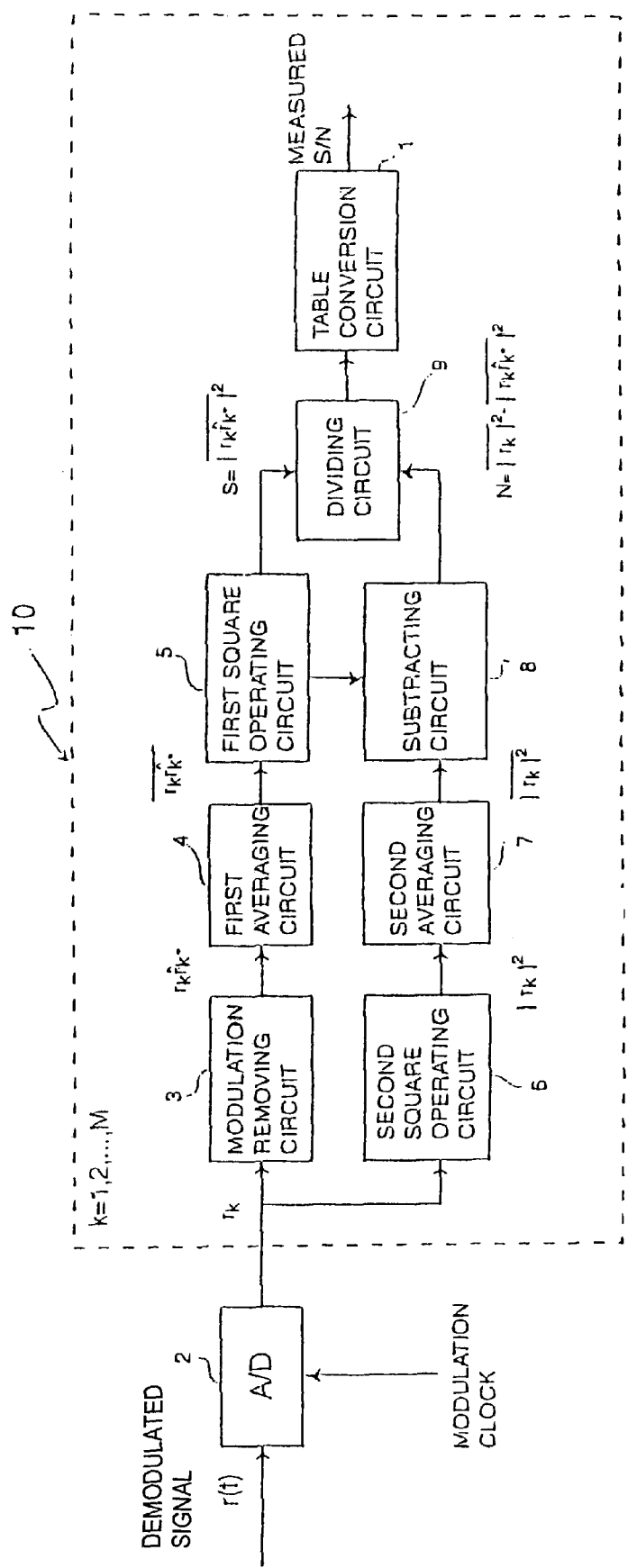
FIG. 1 is a block diagram showing an example of an arrangement of an S/N measuring circuit in accordance with an embodiment of the present invention.

Embodiments of the present invention will be explained by referring to the drawings.

FIG. 1 is a view showing an S/N measuring circuit in an embodiment of the present invention. In FIG. 1, an S/N measuring circuit 10 in the embodiment of the present invention includes a modulation removing circuit 3 connected to an A/D converter 2, a first averaging circuit 4, a first square operating circuit 5, a second square operating circuit 6 connected to the A/D converter 2, a second averaging circuit 7, a subtracting circuit 8, and a dividing circuit 9, and this arrangement is the same as the first prior art shown in FIG. 4. The SIN measuring circuit 10 in the embodiment of the present invention further includes a table conversion circuit 1.

Next, operation of the S/N measuring circuit 10 in the embodiment of the present invention will be explained.

Referring to FIG. 1 again, a demodulated reception signal is sampled at a modulation clock by the A/D converter 2. First, a series of sampled values of a modulated signal that is an output from the A/D converter 2 are averaged over a plurality of symbol sections in the first averaging circuit 4, after a modulated component thereof is removed in the modulation removing circuit 3, and an amplitude value in which a noise component is suppressed is obtained. An output of this averaging circuit 4 is squared by the first square operating circuit 5, and desired signal power S is obtained.

On the other hand, an output of the A/D converter 2 is supplied to the second square operating circuit 6, and is converted into time series having a dimension of electric power. Thereafter, the output is averaged over a plurality of symbol sections by the second averaging circuit 7, and total electric power P of demodulated signals is obtained. The subtracting circuit 8 obtains noise electric power N by subtracting the desired signal power S from the total electric power P of the demodulated signals.

Figure 2:
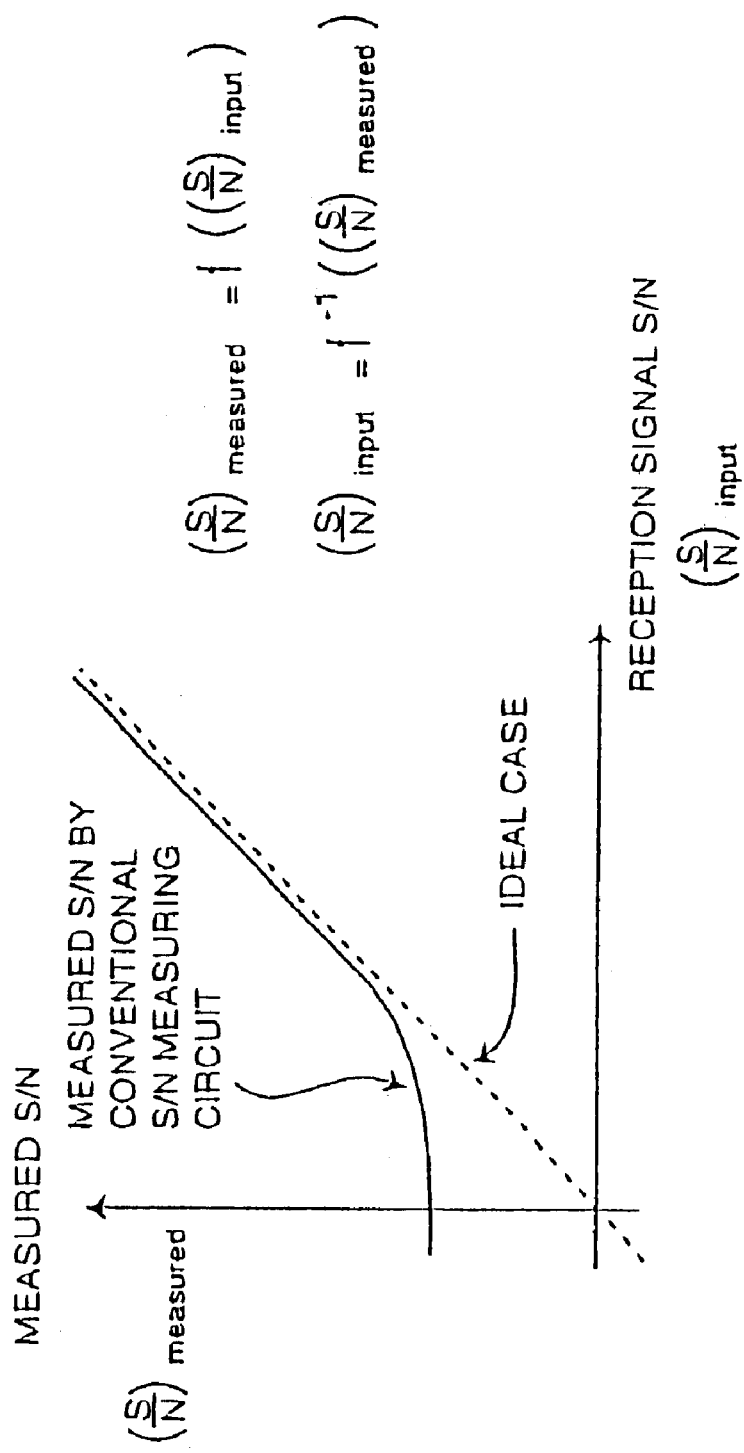
FIG. 2 shows a view showing operation of a table conversion circuit of the S/N measuring circuit in FIG. 1.
Figure 4:
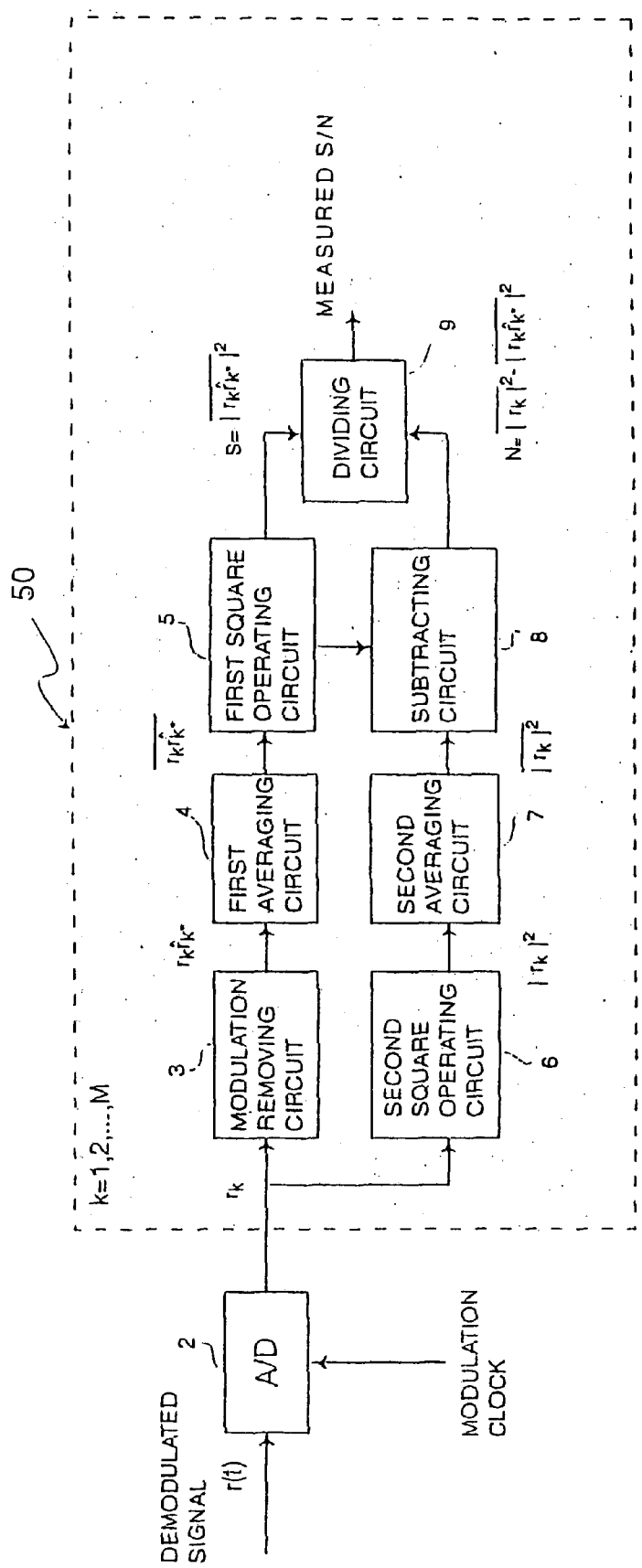
FIG. 4 is a block diagram showing an example of an arrangement of an S/N measuring circuit in a prior art.

Although the operation so far is the same as that of the conventional S/N measuring circuit shown in FIG. 4, in the S/N measuring circuit in the present invention, the table conversion circuit 1 is provided behind the dividing circuit. 9, and converts an S/N output from the dividing circuit 9 and outputs it. In the table conversion circuit 1, as shown in FIG. 2, characteristic that is the reverse of non-linear bias characteristic of the S/N output from the dividing circuit 9 is stored as a table, and the table conversion circuit instantly outputs an S/N value in which a bias is corrected. Thereby, correct S/N measurement becomes to be possible.

Figure 3:
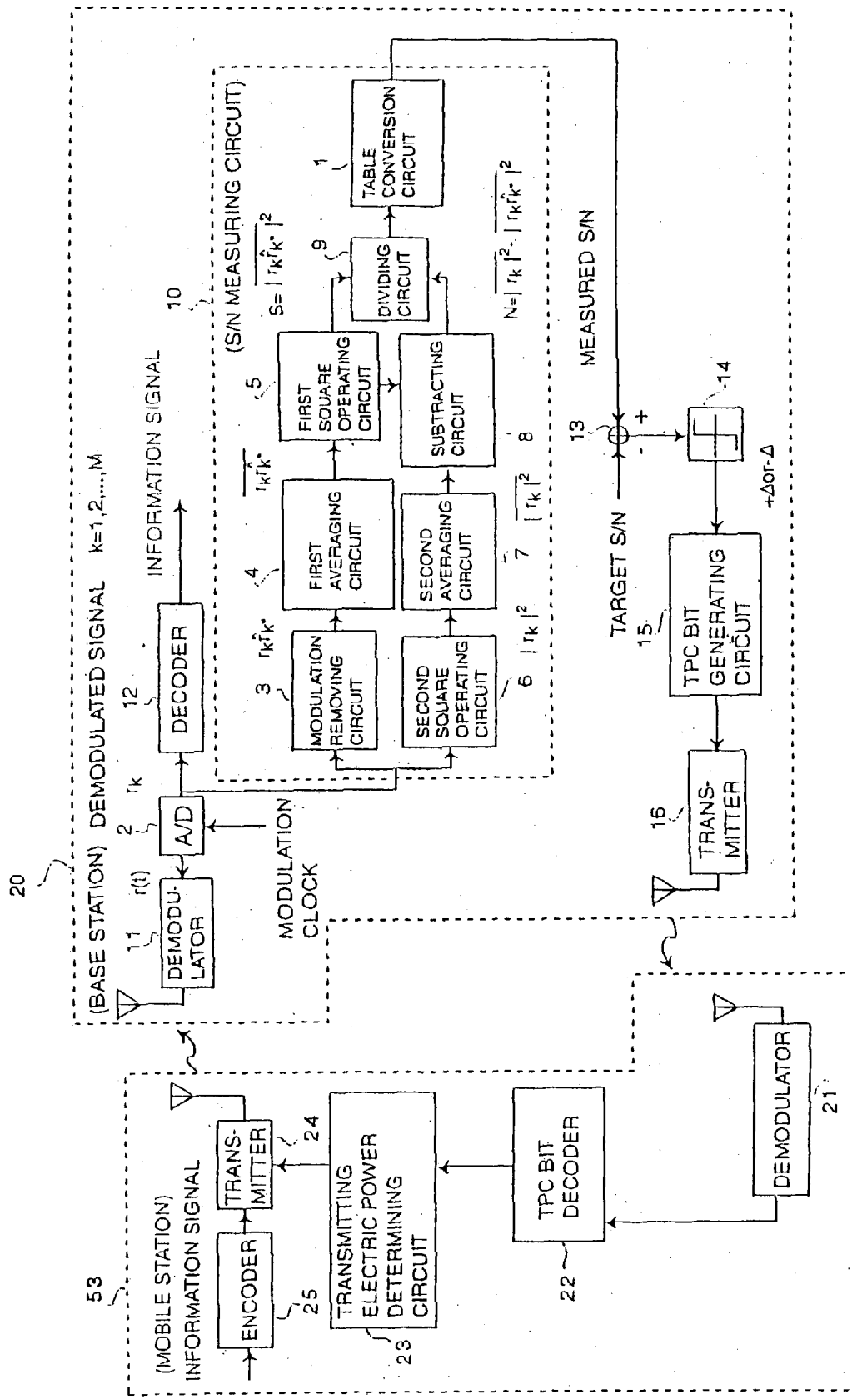
FIG. 3 is a block diagram showing an arrangement of a transmitting electric power control apparatus using the S/N measuring circuit in FIG. 1.

Also, FIG. 3 is a block diagram showing a transmitting electric power control apparatus using the S/N measuring circuit 10 in FIG. 1. In FIG. 3, a base station 20 includes an A/D converter 2, an S/N measuring circuit 10, a demodulator 11 connected to an antenna, a decoder 12, an adder 13, a decision device 14, a TPC bit generating circuit 15, and a transmitter 16 connected to an antenna. Also, a mobile station 53 like the prior art includes a demodulator 21, a TPC bit decoder 22, a transmitting electric power determining circuit 23, a transmitter 24, and an encoder 25.

Operation of the transmitting electric power control apparatus of FIG. 3 will be explained. First, in the base station 20, demodulated signals demodulated by the demodulator 11 are sampled at a modulation clock by the A/D converter 2. A series of sampled values of the demodulated signals that are outputs of the A/D converter 2 are input to the decoder 12, and, after an error is corrected and the signals are decoded, information signals are obtained. In digital mobile communication, although, in order to improve communication quality, coding and error correction decoding processes are generally applied to the information signals, the present invention includes the case in which these processes are not used. On the other hand, an output of the A/D converter 2 is supplied to the S/N measuring circuit 10. The S/N measuring circuit 10 in FIG. 3 has the same arrangement as the S/N measuring circuit 10 shown in FIG. 1, and has a function in which a corrected and accurate S/N value is measured from the sampled value of the demodulated signal and output. In the adder 13, a difference between a measured S/N that is an output from the S/N measuring circuit 10 and a preset control target S/N of transmitting electric power is calculated and supplied to the decision device 14. The decision device 14 determines an amount of increase or decrease of the transmitting electric power to the mobile station 53, based on an output from the adder 13. The determined amount of the increase or decrease of the transmitting electric power is converted into a bit by the TPC bit generating circuit 15, and is transmitted to the mobile station 20 by the transmitter 16.

Figure 5:
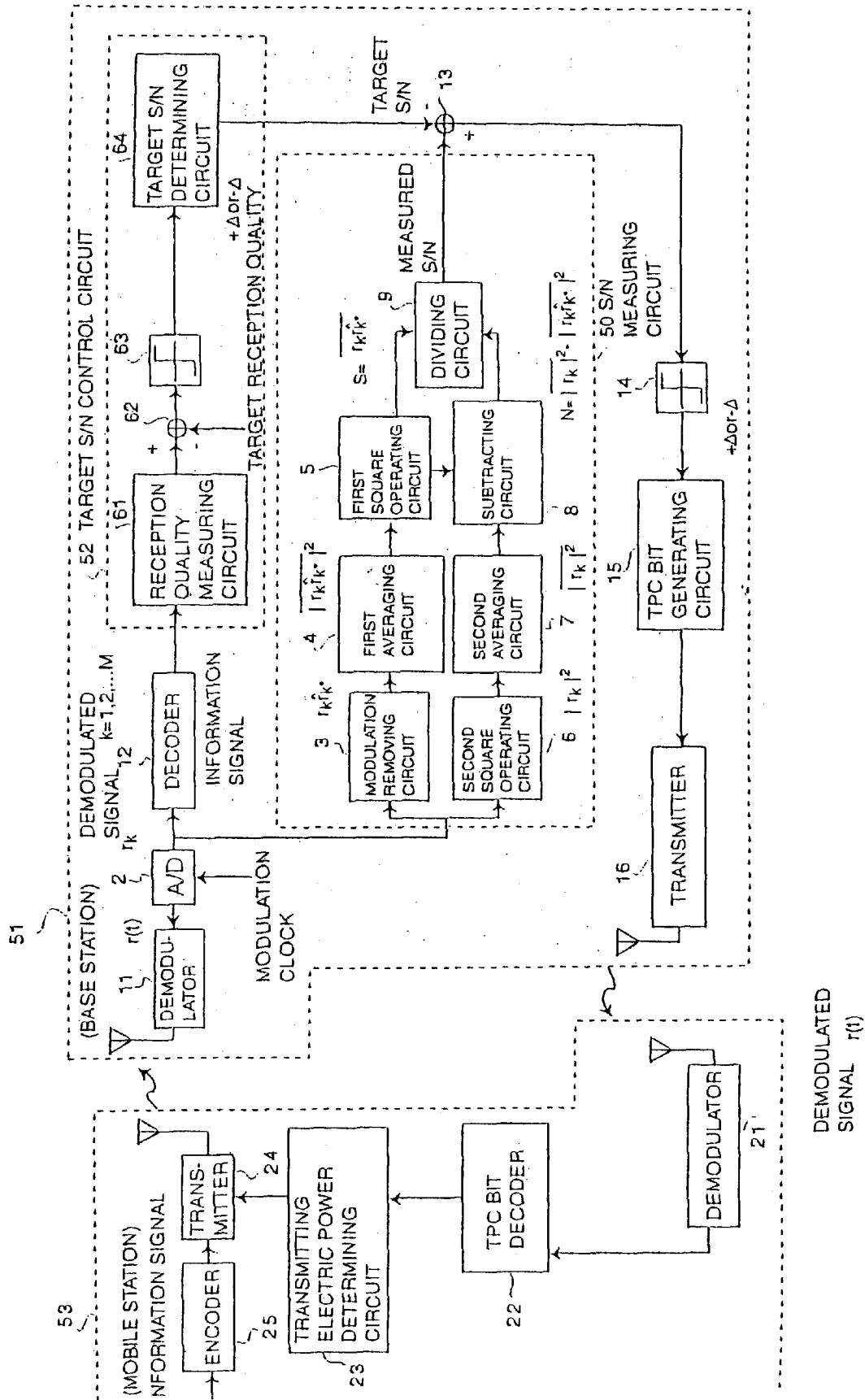
FIG. 5 is a block diagram showing an example of an arrangement of a transmitting electric power control apparatus using the SIN measuring circuit in FIG. 4.

In addition, in the embodiment of the present invention, with regard to the control target S/N of the transmitting electric power, the control or the like using the target S/N control circuit 52 as shown in FIG. 5 is not conducted. On the other hand, in the mobile station 53, the demodulator 21 receives a signal transmitted by the base station and conducts demodulation. A demodulated signal that is an output from the demodulator 21 is input to the TPC bit decoder 22, and the TPC bit decoder decodes the TPC bit generated in the base station 20. The TPC bit decoded in the TPC bit decoder 22 is input to the transmitting electric power determining circuit 23, and transmitting electric power of the mobile station 53 is determined. In accordance with the transmitting electric power determined by the transmitting electric power determining circuit 23, the transmitter 24 transmits a coded information signal.

As explained above, in the present invention, non-linear bias characteristic in the S/N measurement is previously obtained by measurement, the conversion table for realizing this reverse characteristic is created, and when a measured S/N value is output from the dividing circuit, the table conversion circuit receives this S/N value as an input and outputs a corrected S/N value from the above-described conversion table. Therefore, it is possible to provide the S/N measuring circuit capable of measuring the S/N with high accuracy.

Also, in the digital mobile communicating system of the present invention, the above-described corrected and measured S/N is compared with the target S/N in the base station, and the base station transmits a demand for increasing and decreasing the transmitting electric power to the mobile station, and, in accordance with the instruction from the base station, the transmitting electric power is determined in the mobile station. Thereby, it is possible to provide the digital mobile communicating system and the base station thereof, in which it is not necessary to control the target S/N value separately, and transmitting electric power control can be simply realized with high accuracy.

Furthermore, in the present invention, since the outer-loop for correcting an S/N measuring bias is not necessary, a scale of the apparatus becomes to be small. Also, since the apparatus can cope with a fast change of the received S/N, it is possible to provide the transmitting electric power control apparatus capable of conducting the transmitting electric power control with high accuracy. The entire disclosure of Japanese Patent Application No. 9-186388 filed on Jul. 11, 1997 including specification, claims, drawing and summary are incorporated herein by reference in its entirety.

What is claimed is:

1. A S/N measuring circuit comprising:
   a modulation removing circuit, connected to an A/D converter for receiving a demodulated signal that is demodulated from a digitally modulated signal, and sampling said demodulated signal at a modulation clock, said modulation removing circuit removing data modulation by multiplying a sampled value of a signal that is output from said A/D converter by a decision symbol signal;
   a first averaging circuit for averaging an output from said modulation removing circuit over a plurality of symbol sections to suppress a noise superimposed over said demodulated signal;
   a first square operating circuit for squaring an output from said first averaging circuit to obtain a desired signal power;
   a second square operating circuit for applying a square operation to said sampled value of said signal that is an output from said A/D converter;
   a second averaging circuit for averaging an output from said second square operating circuit to obtain total electric power of said demodulated signal;
   a subtracting circuit for subtracting said desired signal power that is an output from said first square operating circuit from said total electric power of said demodulated signal that is an output from said second averaging circuit to obtain noise electric power;
   a dividing circuit for receiving said desired signal power that is an output from said first square operating circuit and said noise electric power that is an output from said subtracting circuit, and calculating an S/N value; and
   a table conversion circuit for receiving said S/N value output from said dividing circuit and outputting an S/N value corrected in accordance with a predetermined conversion table, wherein said table conversion circuit removes a non-linear bias occurred from a symbol error in case that said S/N value output from said dividing circuit is small by providing characteristic by means of said conversion table, which is reverse of characteristic previously obtained by measurement of a corresponding relation between said S/N value output from said dividing circuit and an actual S/N value of said demodulated signal.

2. A transmitting electric power control apparatus for controlling transmitting electric power of an information signal transmitted to a base station from a mobile station, wherein
   said base station comprises:
      a demodulator for receiving a digital modulated and coded information signal and conducting demodulation;
      an A/D converter for sampling an output from said demodulator at a modulation clock;
      a decoder for decoding a demodulated signal that is an output from said A/D converter and outputting an information signal;
      a modulation removing circuit for removing data modulation by multiplying a sampled value of said demodulated signal that is an output from said A/D converter by a decision symbol signal;
      a first averaging circuit for averaging an output from said modulation removing circuit over a plurality of symbol sections to suppress a noise superimposed over said demodulated signal;
      a first square operating circuit for squaring an output from said first averaging circuit to obtain a desired signal power;
      a second square operating circuit for applying square operation to said sampled value of said demodulated signal that is an output from said A/D converter;
      a second averaging circuit for averaging an output from said second square operating circuit over a plurality of symbol sections to obtain total electric power of said demodulated signal;
      a subtracting circuit for subtracting said desired signal power that is an output from said first square operating circuit from said total electric power of said demodulated signal that is an output from said second averaging circuit to obtain noise electric power,
      a dividing circuit for receiving said desired signal power that is an output from said first square operating circuit and said noise electric power that is an output from said subtracting circuit, and obtaining an S/N value;

a table conversion circuit for receiving said S/N value output from said dividing circuit and outputting an S/N value corrected in accordance with a predetermined conversion table;

an adder for obtaining a difference between a measured S/N that is an output from said table conversion circuit and a target S/N that is a control target value of transmitting electric power;

a decision device for determining an amount of increase or decrease of said transmitting electric power, which is instructed to said mobile station, from said difference between said measured S/N and said target S/N, which is an output from said adder;

a TPC bit generating circuit for converting an output result from said decision device into a bit; and a transmitter for transmitting a TPC bit determined in said TPC bit generating circuit to said mobile station, and wherein said mobile station comprises:

a demodulator for receiving a digital modulated TPC signal and conducting demodulation;

a TPC bit decoder for deciding a TPC bit from an output from said demodulator;

a transmitting electric power determining circuit for receiving said TPC bit that is an output from said TPC bit decoder and determining transmitting electric power of said mobile station; and a transmitter for transmitting a coded information signal based on said transmitting electric power determined by said transmitting electric power determining circuit, wherein said table conversion circuit removes a non-linear bias occurred from a symbol error in case that said S/N value output from said dividing circuit is small by providing characteristic by means of said conversion table, which is reverse of characteristic previously obtained by measurement of a corresponding relation between said S/N value output from said dividing circuit and an actual S/N value of said demodulated signal.

3. An S/N measuring method comprising:

(a) removing data modulation by multiplying a sampled value of a demodulated signal that is an output from an A/D converter by a decision symbol signal, said A/D converter receiving a demodulated signal that is demodulated from a digitally modulated signal, and sampling said demodulated signal at a modulation clock;

(b) averaging said demodulated signal in which said data modulation is removed, over a plurality of symbol sections to suppress a noise superimposed over said demodulated signal;

(c) squaring said averaged signal to obtain a desired signal power;

(d) applying square operation to said sampled value of said demodulated signal that is an output from said A/D converter;

(e) averaging said squared value over a plurality of symbol sections to obtain total electric power of said demodulated signal;

(f) subtracting said desired signal power from said total electric power to obtain noise electric power;

(g) receiving said desired signal power and said noise electric power, and calculating an S/N value; and (h) receiving said S/N value and outputting an S/N value corrected in accordance with a predetermined conversion table, wherein said (h) includes removing a non-linear bias occurred from a symbol error in case that said S/N value is small by providing characteristic by means of said conversion table, which is reverse of characteristic previously obtained by measurement of a corresponding relation between said S/N value and an actual S/N value of said demodulated signal.

* * * * *